US009574264B2

(12) United States Patent
Liang et al.

(10) Patent No.: US 9,574,264 B2
(45) Date of Patent: Feb. 21, 2017

(54) METHOD AND APPARATUS FOR STABLY EVAPORATION DEPOSITING UNIFORM THIN FILMS

(71) Applicant: NATIONAL CHUNG-SHAN INSTITUTE OF SCIENCE AND TECHNOLOGY, Taoyuan (TW)

(72) Inventors: Shih-Chang Liang, Taoyuan (TW); Wei-Chieh Huang, Taoyuan (TW); Chao-Nan Wei, Taoyuan (TW); Cuo-Yo Ni, Taoyuan (TW); Hui-Yun Bor, Taoyuan (TW)

(73) Assignee: NATIONAL CHUNG-SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 0 days.

(21) Appl. No.: 14/716,882

(22) Filed: May 20, 2015

(65) Prior Publication Data
US 2016/0097117 A1   Apr. 7, 2016

(30) Foreign Application Priority Data

Oct. 3, 2014  (TW) .............................. 103134501 A

(51) Int. Cl.
*C23C 16/448* (2006.01)
*C23C 14/24* (2006.01)

(52) U.S. Cl.
CPC ............. *C23C 14/24* (2013.01); *C23C 14/243* (2013.01)

(58) Field of Classification Search
CPC ........................ C23C 16/4485; C23C 16/45512
See application file for complete search history.

(56) References Cited

U.S. PATENT DOCUMENTS

| | | | |
|---|---|---|---|
| 4,543,275 A * | 9/1985 | Akashi | B05D 1/60 427/250 |
| 7,194,197 B1 | 3/2007 | Wendt et al. | |
| 7,968,353 B2 | 6/2011 | Britt et al. | |
| 8,202,368 B2 | 6/2012 | Britt et al. | |

(Continued)

OTHER PUBLICATIONS

Ho, Clifford K., et al., "Evaporation of pendant water droplets in fractures". Water Resources Research, vol. 33, No. 12, pp. 2665-2671, Dec. 1997.*

(Continued)

*Primary Examiner* — Bret Chen
(74) *Attorney, Agent, or Firm* — Leong C. Lei

(57) ABSTRACT

In a method for evaporation depositing uniform thin films, a film is deposited on a substrate of a vacuum environment while maintaining a constant deposition rate. A cover is installed on a wall of the evaporation vessel. When the evaporation material is heated to an evaporation state and the interior of the evaporation vessel reaches a first vapor saturation pressure, the vapor of the evaporation material flows towards a pressure stabilizing chamber. When the pressure stabilizing chamber reaches a second vapor saturation pressure which is smaller than the first vapor saturation pressure, the vacuum environment has a vacuum background pressure which is smaller than the second vapor saturation pressure, so that the evaporation material vapor flows from the pressure stabilizing chamber towards the vacuum environment at constant rate due to the pressure difference, so as to evaporate the substrate.

3 Claims, 9 Drawing Sheets

(56) References Cited

U.S. PATENT DOCUMENTS

| | | |
|---|---|---|
| 2004/0022942 A1* | 2/2004 | Schade van Westrum .......... C23C 14/24 427/248.1 |
| 2007/0178225 A1* | 8/2007 | Takanosu ............ C23C 14/243 427/69 |
| 2008/0118630 A1* | 5/2008 | Park .................... C23C 14/547 427/9 |
| 2009/0255469 A1 | 10/2009 | Britt et al. |
| 2009/0258444 A1 | 10/2009 | Britt et al. |
| 2009/0258476 A1 | 10/2009 | Britt et al. |
| 2010/0087016 A1 | 4/2010 | Britt et al. |
| 2010/0159132 A1 | 6/2010 | Conroy et al. |
| 2010/0285218 A1 | 11/2010 | Conroy et al. |
| 2013/0045563 A1 | 2/2013 | Zachmann et al. |
| 2013/0105772 A1* | 5/2013 | Kawahara ............ H01L 51/004 257/40 |

OTHER PUBLICATIONS

Price, D, "Volatilisation, Evaporation and Vapour Pressure Studies Using a Thermobalance." Journal of Thermal Analysis and Calorimetry (2001) 64: 315-322. doi:10.1023/A:1011522020908.*

* cited by examiner

S01 — Place at least one evaporation material in at least one evaporation vessel, heat the evaporation material by at least one heater, and install a cover on a wall of the evaporation vessel

S02 — Control the evaporation by the cover, such that the interior of the evaporation vessel has a first vapor saturation pressure, when the evaporation material is heated to an evaporation state

S03 — Now, the vapor of the evaporation material flows towards a pressure stabilizing chamber, such that the interior of the pressure stabilizing chamber has a second vapor saturation pressure, wherein the second vapor saturation pressure is smaller than the first vapor saturation pressure, so that the vapor of the evaporation material continues flowing into the pressure stabilizing chamber

S04 — The vacuum system environment has a vacuum background pressure smaller than the second vapor saturation pressure, and the vapor of the evaporation material flows from the pressure stabilizing chamber to the vacuum system environment due to the pressure difference between the second vapor saturation pressure and the vacuum background pressure, so as to evaporate the substrate at a constant speed

Fig. 1

METHOD AND APPARATUS FOR STABLY EVAPORATION DEPOSITING UNIFORM THIN FILMS

CROSS-REFERENCE TO RELATED APPLICATIONS

This non-provisional application claims priority under 35 U.S.C. §119(a) on Patent Application No(s). 103134501 filed in Taiwan, R.O.C. on Oct. 3, 2014, the entire contents of which are hereby incorporated by reference.

BACKGROUND OF THE INVENTION

1. Field of the Invention

The present invention relates to the field of film deposition, and more particularly to a method and apparatus for evaporation depositing uniform thin films, and both method and apparatus maintain a constant evaporation rate to improve the uniformity and quality of the thin films.

2. Description of the Related Art

Vapor deposition is applied extensively in the industry for manufacturing components composed of thin films such as organic light emitting diodes (OLED) and thin film solar cells. In general, the vapor deposition is applied in a vacuum system to place an evaporation material in an evaporation vessel and use a heater to heat the evaporation material, such that the evaporation material is evaporated and volatilized to achieve the effect of forming a thin film on an evaporation material.

In the vapor deposition process, the following issues are confronted frequently: 1. Since the evaporation material is in contact with a vacuum environment system directly through an evaporation source spout. From the related literature "Ind. Eng. Chem. Res. 2009, 48, 5975-5991, Ind. Eng. Chem. Res. 2009, 48, 5992-5999", the evaporation material gradually decreases with time, and the drop of the level of an evaporated liquid causes a temperature difference between the center and the edge of the evaporation vessel and results in a change of the deposition rate, so that the process cannot be controlled or quantized effectively. 2. To achieve the purpose of mass production, the vapor deposition process usually adopts the design of a linear evaporation source for the film deposition to obtain a large thin film, particularly an absorbing layer of a copper-indium-gallium-selenium thin-film solar cell, and requires a plurality of independent evaporation sources to carry out the mixing and evaporation of the evaporation material as disclosed in U.S. Pat. Nos. 2010/0285218A1, 2010/0159132A1, U.S. Pat. Nos. 7,968,353B2, 8,202,368B2, 7,194,197B1, 2009/0255469A1, 2009/0258444A1, 2010/0087016A1, 2009/0258476A1, 2013/0045563A1 and U.S. Pat. No. 7,194,197B1. In these mixed vapor deposition processes, different evaporation materials may cause a non-uniformity of the thin film coated on the evaporation material according to the different evaporation distances from the center of each independent linear evaporation source, and the linear evaporation sources may interfere with one another during the mixing and evaporation process of the evaporation material due to the evaporation angle of each linear evaporation source, so that the uniformity of the thin film is reduced significantly. 3. The depth profile of the produced thin film may be non-uniform when the evaporated material moves in a roll-to-roll or flow manner in a direction perpendicular to each independent evaporation source.

In view of the aforementioned drawback of the conventional film deposition, the inventor of the present invention provides a method for stably evaporation depositing uniform thin films to produce the thin films with high stability, uniformity and production quality.

SUMMARY OF THE INVENTION

Therefore, it is a primary objective of the present invention to provide a method and method for evaporation depositing uniform thin films and prevent a change of the evaporation rate and the composition varied with time and occurred during the evaporation process. If several materials are used for the mixing process and evaporation, the evaporation angles of different materials may cause a poor uniformity of the thin film uniformity. With the present invention, the thin films with large area, high stability, and excellent uniformity can be produced.

To achieve the aforementioned objective, the present invention provides a method for evaporation depositing uniform thin films on a substrate of a vacuum environment system to enhance the uniformity of the thin film by maintaining the deposition rate, and the method comprising the steps of: placing at least one evaporation material in at least one evaporation vessel, and heating the evaporation material by at least one heater, wherein a cover is installed on a wall of the evaporation vessel; controlling the evaporation by the cover, such that the interior of the evaporation vessel has a first vapor saturation pressure when the evaporation material is heated to an evaporation state; flowing the vapor of the evaporation material towards a pressure stabilizing chamber, such that the interior of the pressure stabilizing chamber has a second vapor saturation pressure, wherein the second vapor saturation pressure is smaller than the first vapor saturation pressure, so that the vapor of the evaporation material continues flowing into the pressure stabilizing chamber; and the vacuum environment system has a vacuum background pressure, and the vacuum background pressure is smaller than the second vapor saturation pressure, and the vapor of the evaporation material flows from the pressure stabilizing chamber to the vacuum environment system due to the pressure difference between the second vapor saturation pressure and the vacuum background pressure, so as to evaporate the substrate at a constant rate.

Preferably, the cover is installed at the top of the evaporation vessel, but the present invention is not limited to such arrangement only. In addition, the evaporation material comes with a plural quantity, and the evaporation materials are disposed at corresponsive spaces inside the evaporation vessel respectively, and when the space of each evaporation vessel reaches the first vapor saturation pressure, the evaporation materials flow into the pressure stabilizing chamber one by one and mix with one another, and the first vapor saturation pressure in the space of each evaporation vessel may be set to be the same or different.

Alternatively, the evaporation material comes with a plural quantity, and the evaporation materials are disposed at corresponsive spaces inside the evaporation vessel respectively, and the pressure stabilizing chamber also comes with a quantity corresponsive to the quantity of the evaporation vessels, so that when the space of each evaporation vessel reaches the first vapor saturation pressure, the evaporation materials flow into the pressure stabilizing chambers, and then flow from the respective pressure stabilizing chambers into the vacuum environment system for mixing and evaporating the substrate.

The present invention further provides an apparatus for stably evaporation depositing uniform thin films for a film deposition of a substrate disposed in a vacuum environment system to enhance the uniformity of the thin film by maintaining the deposition rate, and the apparatus comprising: at least one evaporation vessel, having an evaporation material contained therein; at least one cover, covered onto a wall of the evaporation vessel to seal the evaporation vessel, and having a flow hole formed thereon; at least one heater, for heating the evaporation vessel, so that the interior of the evaporation vessel has a first vapor saturation pressure; and at least one pressure stabilizing chamber, disposed on a side of the evaporation vessel, and having a nozzle orifice, such that when the evaporation vessel reaches the first vapor saturation pressure, the vapor of the evaporation material flows from the flow hole into the pressure stabilizing chamber, and the interior of the pressure stabilizing chamber has a second vapor saturation pressure, wherein the vacuum environment system has a vacuum background pressure, and the second vapor saturation pressure is smaller than the first vapor saturation pressure and greater than the vacuum background pressure, and the vapor of the evaporation material flows from the nozzle orifice into the vacuum environment system due to the pressure difference between the vacuum background pressure and the second vapor saturation pressure, so as to form a thin film on the substrate at a constant evaporation rate.

In addition, the flow hole of the cover may be a hole controlled by a switch or at least one simple hole, and operated together with the heater to control or set the value of the first vapor saturation pressure, and the nozzle orifice may also be a hole controlled by a switch or at least one simple hole, and the switch and size of the flow hole and the nozzle orifice may be controlled to adjust the value of the second vapor saturation pressure.

Preferably, the cover is installed at the top of the evaporation vessel, and the flow hole and the nozzle orifice are disposed at different axes to prevent the vapor of the evaporation material flowing from the evaporation vessel to the pressure stabilizing chamber from continuing its flow towards the vacuum environment system even if the second vapor saturation pressure has not been reached. However, the present invention is not limited to such arrangement only.

In addition, the evaporation material comes with a plural quantity, and the evaporation materials are disposed at corresponsive spaces inside the evaporation vessel respectively, and the pressure stabilizing chamber also comes with a quantity corresponsive to the quantity of the evaporation vessels, so that when the space of each evaporation vessel reaches the first vapor saturation pressure, the evaporation materials flow into the pressure stabilizing chambers and mix with one another, and then flow from the nozzle orifice into the vacuum environment system, and the first vapor saturation pressure in the space of each evaporation vessel may be set to be the same or different.

Alternatively, the evaporation material comes with a plural quantity, and the evaporation materials are disposed at corresponsive spaces inside the evaporation vessel respectively, and the pressure stabilizing chamber also comes with a quantity corresponsive to the quantity of the evaporation vessels, so that when the space of each evaporation vessel reaches the first vapor saturation pressure, the evaporation materials flow into the pressure stabilizing chambers, and then flow into the vacuum environment system for mixing and evaporating the substrate.

With the technical characteristics of the present invention, the uniformity of the thin films formed by evaporation can be improved effectively, and the evaporation rate or composition varied with time during the vapor deposition process or the non-uniformity caused by the mixing and evaporation of different material can be prevented. Therefore, the stable vapor deposition process produces the thin films with uniform distribution of profile and thickness.

BRIEF DESCRIPTION OF THE DRAWINGS

FIG. 1 is a flow chart of a preferred embodiment of the present invention;

DETAILED DESCRIPTION OF THE PREFERRED EMBODIMENTS

Figure 2:
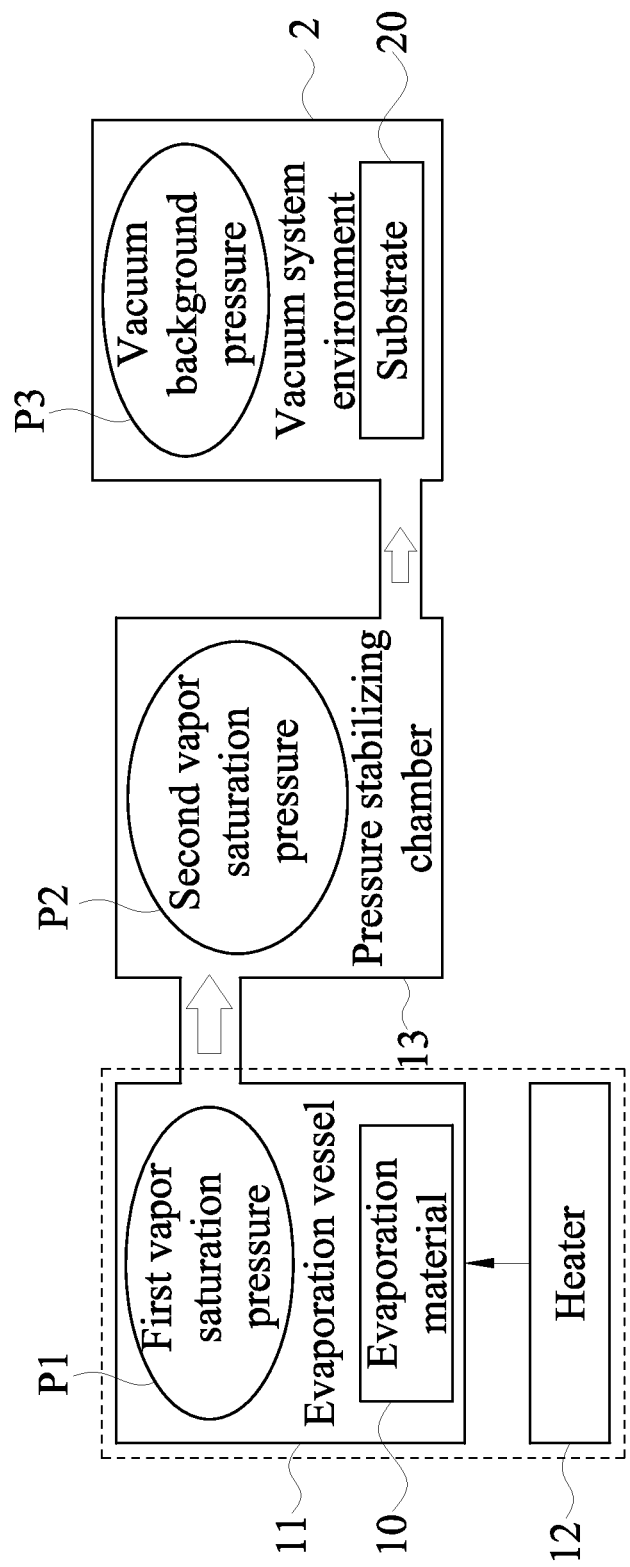
FIG. 2 is a schematic block diagram of a preferred embodiment of the present invention.

The technical content of the present invention will become apparent with the detailed description of preferred embodiments and the illustration of related drawings as follows.

With reference to FIGS. 1 to 4 for a flow chart and a schematic block diagram of a method for evaporation depositing uniform thin films in accordance with a preferred embodiment of the present invention and two schematic block diagrams of a method for evaporation depositing uniform thin films in accordance with a preferred embodiment of the present invention provided that there is a plurality of evaporation materials respectively, the method is provided for a film deposition on a substrate 20 disposed in a vacuum environment system 2, wherein the uniformity of the thin film is enhanced by maintaining a constant deposition rate. The method comprises the following steps.

S01: Place at least one evaporation material 10 in at least one evaporation vessel 11, and heat the evaporation material 10 by at least one heater 12, wherein a cover is installed on a wall of the evaporation vessel 11. Preferably, the cover is installed on the evaporation vessel 11, but the present invention is not limited to such arrangement only.

S02: Control the evaporation by the cover, such that the interior of the evaporation vessel 11 has a first vapor saturation pressure P1, when the evaporation material 10 is heated to an evaporation state. For example, the evaporation material 10 is a metal such as indium or gallium, which is placed in the evaporation vessel 11 and then heated and evaporated by the heater 12, so that the interior of the evaporation vessel 11 can reach the first vapor saturation pressure P1.

S03: Carry out this step when the interior of the evaporation vessel 11 reaches the first vapor saturation pressure P1. Now, the vapor of the evaporation material 10 flows towards a pressure stabilizing chamber 13, such that the interior of the pressure stabilizing chamber 13 has a second vapor saturation pressure P2, wherein the second vapor saturation pressure P2 is smaller than the first vapor saturation pressure P1, so that the vapor of the evaporation material 10 continues flowing into the pressure stabilizing chamber 13. Wherein, the second vapor saturation pressure P2 and the first vapor saturation pressure P1 are constant, and the second vapor saturation pressure P2 is smaller than the first vapor saturation pressure P1 to form a constant pressure difference. Therefore, the vapor of the evaporation material 10 in the evaporation vessel 11 will continue flowing towards the pressure stabilizing chamber 13.

S04: The vacuum environment system 2 has a vacuum background pressure P3, and the vacuum background pressure P3 is smaller than the second vapor saturation pressure P2, and the vapor of the evaporation material 10 flows from the pressure stabilizing chamber 13 to the vacuum environment system 2 due to the pressure difference between the second vapor saturation pressure P2 and the vacuum background pressure P3, so as to evaporation depositing the substrate 20 at a constant rate. The vacuum environment system 2 is maintained at the vacuum background pressure P3 by a vacuum pump, and the vacuum background pressure P3 is smaller than the second vapor saturation pressure P2, so that the vapor of the evaporation material 10 flows towards the vacuum environment system 2 due to the pressure difference between the second vapor saturation pressure P2 and the vacuum background pressure P3. Since the pressure difference between the second vapor saturation pressure P2 and the vacuum background pressure P3 is substantially constant, therefore the evaporation material 10 will flow into the vacuum environment system 2 at a constant rate to perform a film deposition of the substrate 20, so as to achieve a highly stable evaporation effect.

Figure 3:
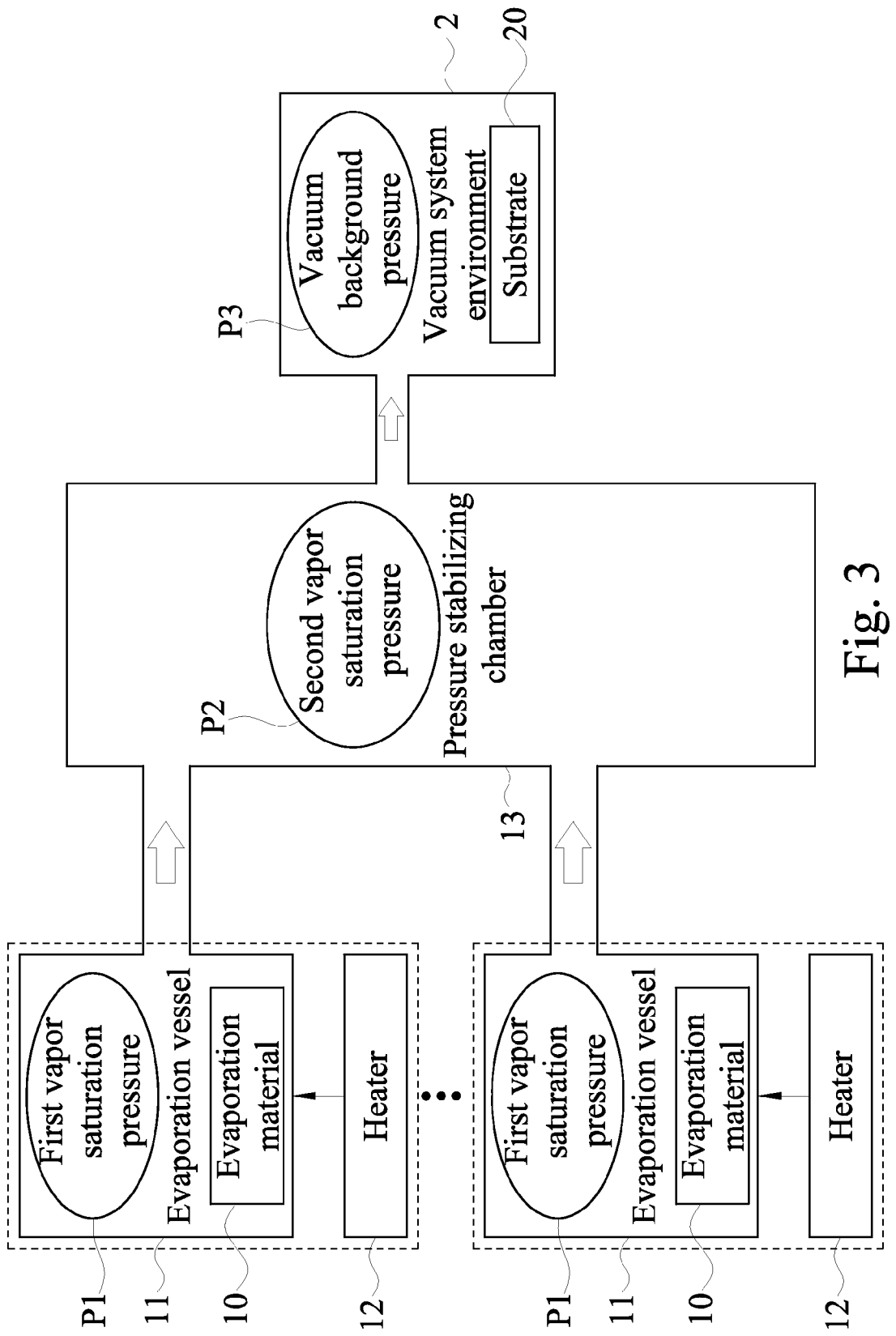
FIG. 3 is a schematic block diagram of a preferred embodiment of the present invention, provided that there is a plurality of evaporation materials.

In FIG. 3, the evaporation material 10 comes with a plural quantity, and the evaporation materials 10 are placed in the evaporation vessel 11, and the evaporation materials 10 flow into the pressure stabilizing chamber 13 one by one and mix with one another when the space of each evaporation vessel 11 has the first vapor saturation pressure P1. Wherein, the first vapor saturation pressure P1 of each evaporation vessel 11 may be the same or different, and regardless of the magnitude of the first saturation pressure P1 in each evaporation vessel 11, the evaporation materials 10 flow into the pressure stabilizing chamber 13 and mix with one another when the corresponsive first saturation pressure P1 is reached. After the evaporation materials 10 are mixed, and the second vapor saturation pressure P2 is reached, the evaporation materials 10 flow into the vacuum environment system 2 to perform the film deposition of the substrate 20. Therefore, the vapor of the evaporation materials 10 are mixed in the pressure stabilizing chamber 13 first, and then the film deposition is carried out at a constant rate to assure the uniformity of the thin film.

Figure 4:
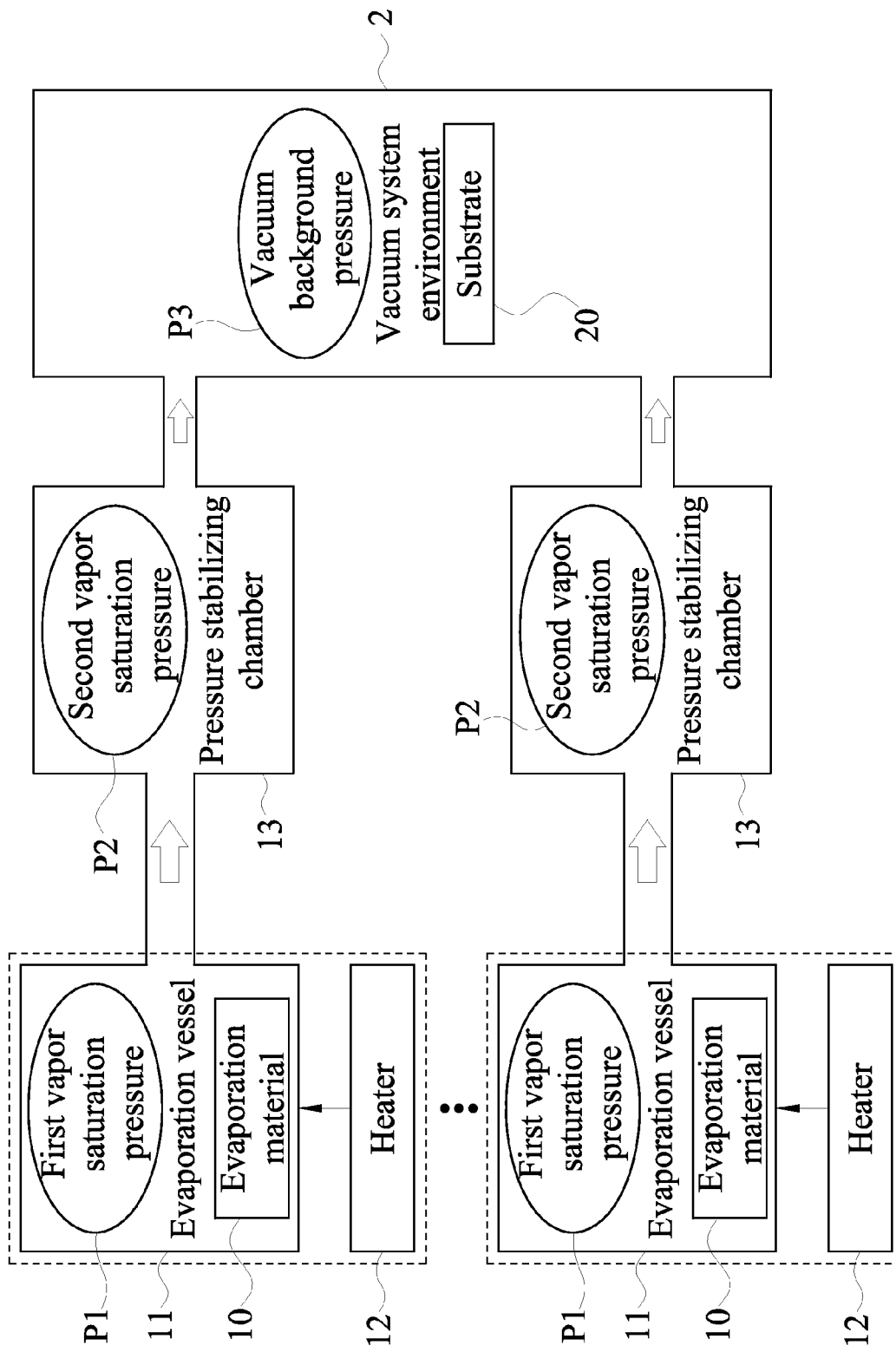
FIG. 4 is another schematic block diagram of a preferred embodiment of the present invention, provided that there is a plurality of evaporation materials.

In FIG. 4, when the evaporation material 10 comes with a plural quantity, the evaporation materials 10 are placed in the evaporation vessel 11, and the quantity of the pressure stabilizing chambers 13 is set according to the quantity of the evaporation vessels 11. In other words, each evaporation vessel 11 has a respective pressure stabilizing chamber 13, and when each evaporation vessel 11 reaches the first vapor saturation pressure P1, the evaporation materials 10 flow into the pressure stabilizing chambers 13 respectively, and then flow from the pressure stabilizing chambers 13 into the vacuum environment system 2 to perform a mixing and evaporation deposition of the substrate 20. Wherein, the first vapor saturation pressure P1 of each evaporation vessel 11 may be the same or different, and the second vapor saturation pressure P2 of each pressure stabilizing chamber 13 may also be the same or different. Since the vapor of the evaporation material 10 continues flowing from the evaporation vessel 11 towards the pressure stabilizing chamber 13 due to the restriction of the second vapor saturation pressure P2 being smaller than the first vapor saturation pressure P1, therefore regardless of the first vapor saturation pressure P1 and the second vapor saturation pressure P2 between each evaporation vessel 11 and each pressure stabilizing chamber 13 being the same, the vapor of the evaporation material 10 flows along a path as shown in FIG. 4.

Figure 5:
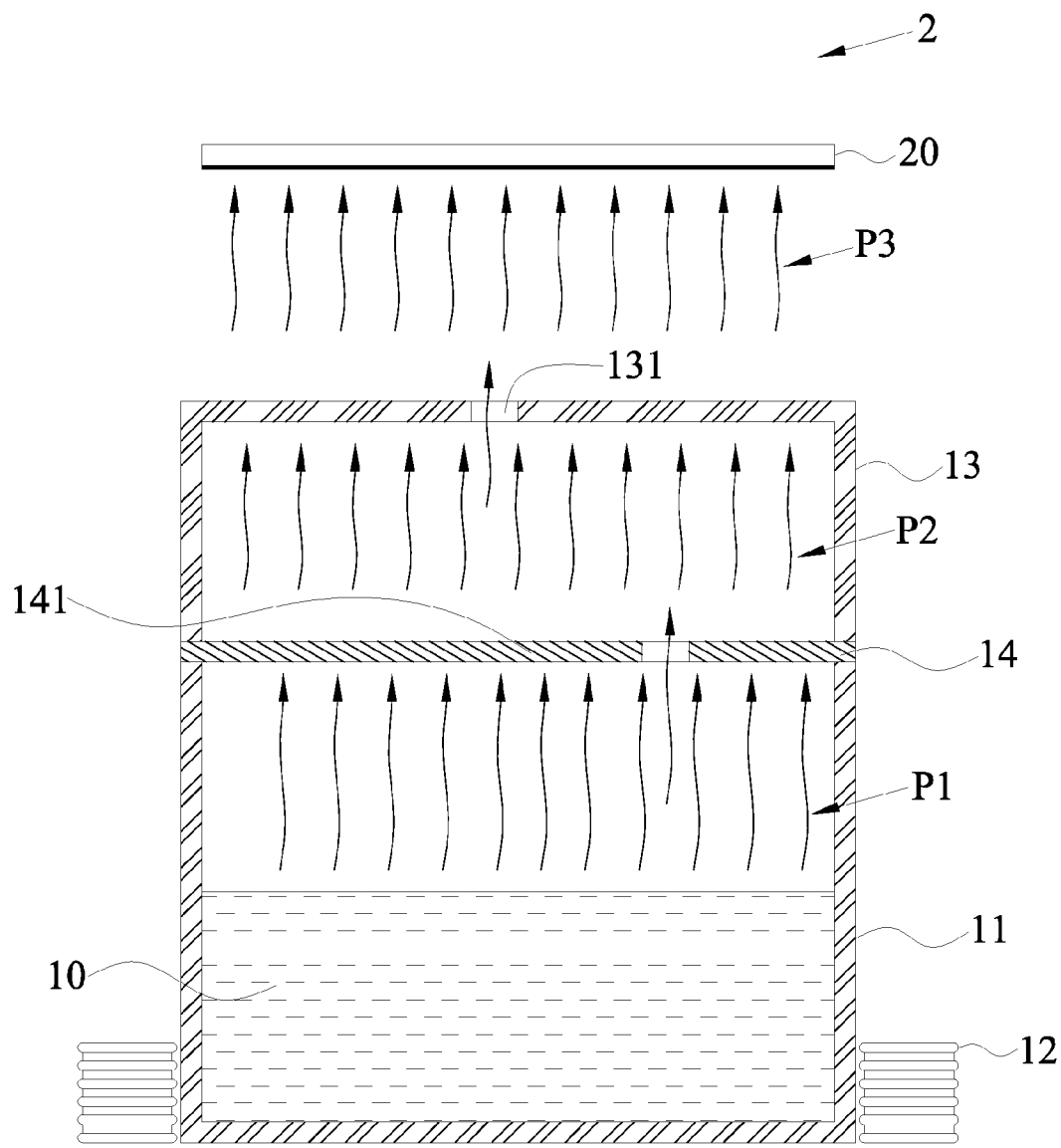
FIG. 5 is a schematic view of an apparatus of a preferred embodiment of the present invention.

With reference to FIG. 5 for a schematic view of an apparatus for stably evaporation depositing uniform thin films in accordance with a preferred embodiment of the present invention, the apparatus is provided for evaporation depositing the thin film on a substrate in a vacuum environment system to enhance the uniformity of the thin film by maintaining the deposition rate, and the apparatus comprises at least one evaporation vessel 11, at least one cover 14, at least one heater 12 and at least one pressure stabilizing chamber 13.

The evaporation vessel 11 contains an evaporation material 10 which is a metallic element, such as indium or gallium, and the cover 14 is covered onto a wall of the evaporation vessel 11 to seal the evaporation vessel 11, and the cover 14 has at least one flow hole 141 formed thereon. Preferably, the cover 14 is installed at the top of the evaporation vessel 11, but the present invention is not limited to such arrangement only. The heater 12 is provided for heating the evaporation vessel 11, and the cover 14 restricts the evaporation of the evaporation material 10, so that the evaporation vessel 11 has the first vapor saturation pressure P1.

The pressure stabilizing chamber 13 is disposed on a side of the evaporation vessel 11 and has a nozzle orifice 131. When the evaporation vessel 11 reaches the first vapor saturation pressure P1, the vapor of the evaporation material 10 flows from the flow hole 141 into the pressure stabilizing chamber 13, and the pressure stabilizing chamber 13 has a second vapor saturation pressure P2, wherein the vacuum environment system 2 has a vacuum background pressure P3, and the second vapor saturation pressure P2 is smaller than the first vapor saturation pressure P1 and greater than the vacuum background pressure P3, so that the vapor of the evaporation material 10 heated in the evaporation vessel 11 continues flowing from the evaporation vessel 11 towards the pressure stabilizing chamber 13 due to the pressure difference between the first vapor saturation pressure P1 and the second vapor saturation pressure P2, and then the vapor of the evaporation material 11 flows from the nozzle orifice 131 into the vacuum environment system 2 due to the pressure difference between the second vapor saturation pressure P2 and the vacuum background pressure P3, so as to form a thin film on the substrate 20 at a constant rate. It is noteworthy that the flow hole 141 and the nozzle orifice 131 are preferably disposed at different axes to prevent the vapor of the evaporation material 10 from flowing from the evaporation vessel 11 into the pressure stabilizing chamber 13 through the flow hole 141 when the pressure stabilizing chamber 13 has not reached the second vapor saturation pressure P2 as shown in FIG. 5. On the other hand, if the flow hole 141 and the nozzle orifice 131 are disposed at the same axis, then the vapor of the evaporation material 10 will flow from the nozzle orifice 131 into the vacuum environment system 2 directly. Therefore, the arrangement of the flow hole 141 and the nozzle orifice 131 at different axes can control the flowing speed of the vapor of the evaporation material 10 into the vacuum environment system 2 effectively. Wherein, the flow hole 141 of the cover 14 is at least one hole or a hole that can be adjusted, opened or shut, and the cover 14 may be operated together with the heater 12 to control and set the value of the first vapor saturation pressure P1, and the nozzle orifice 131 is also a hole or a hole that can be controlled, opened or shut, and the value of the second vapor saturation pressure P2 may be adjusted by opening, shutting or adjusting the size of the flow hole 141 and the nozzle orifice 131.

In addition, the evaporation material 10 comes with a plural quantity, and the evaporation materials 10 are placed in the evaporation vessel 11, and when the space of each evaporation vessel 11 reaches the first vapor saturation pressure P1, the evaporation materials 10 flow into the pressure stabilizing chamber 13 one by one and mix with one another, and then flow from the nozzle orifice 131 into the vacuum environment system 2 to perform a film deposition of the substrate 20. Alternatively, when the evaporation material 10 comes with a plural quantity, and the evaporation materials 10 are placed in the evaporation vessel 11, the quantity of the pressure stabilizing chambers 13 is set corresponsive to the quantity of the evaporation vessels 11, so that when each evaporation vessel 11 reaches the first vapor saturation pressure P1, the evaporation material 10 flows into the respective pressure stabilizing chamber 131 and then flows from each pressure stabilizing chamber 131 into the vacuum environment system 2 to perform mixing and evaporation of the substrate 20. Wherein, the first vapor saturation pressure P1 of each evaporation vessel 11 may be the same or different, and when the pressure stabilizing chamber 13 comes with a plural quantity, the second vapor saturation pressure P2 of each pressure stabilizing chamber 13 may also be the same or different.

Figure 6:
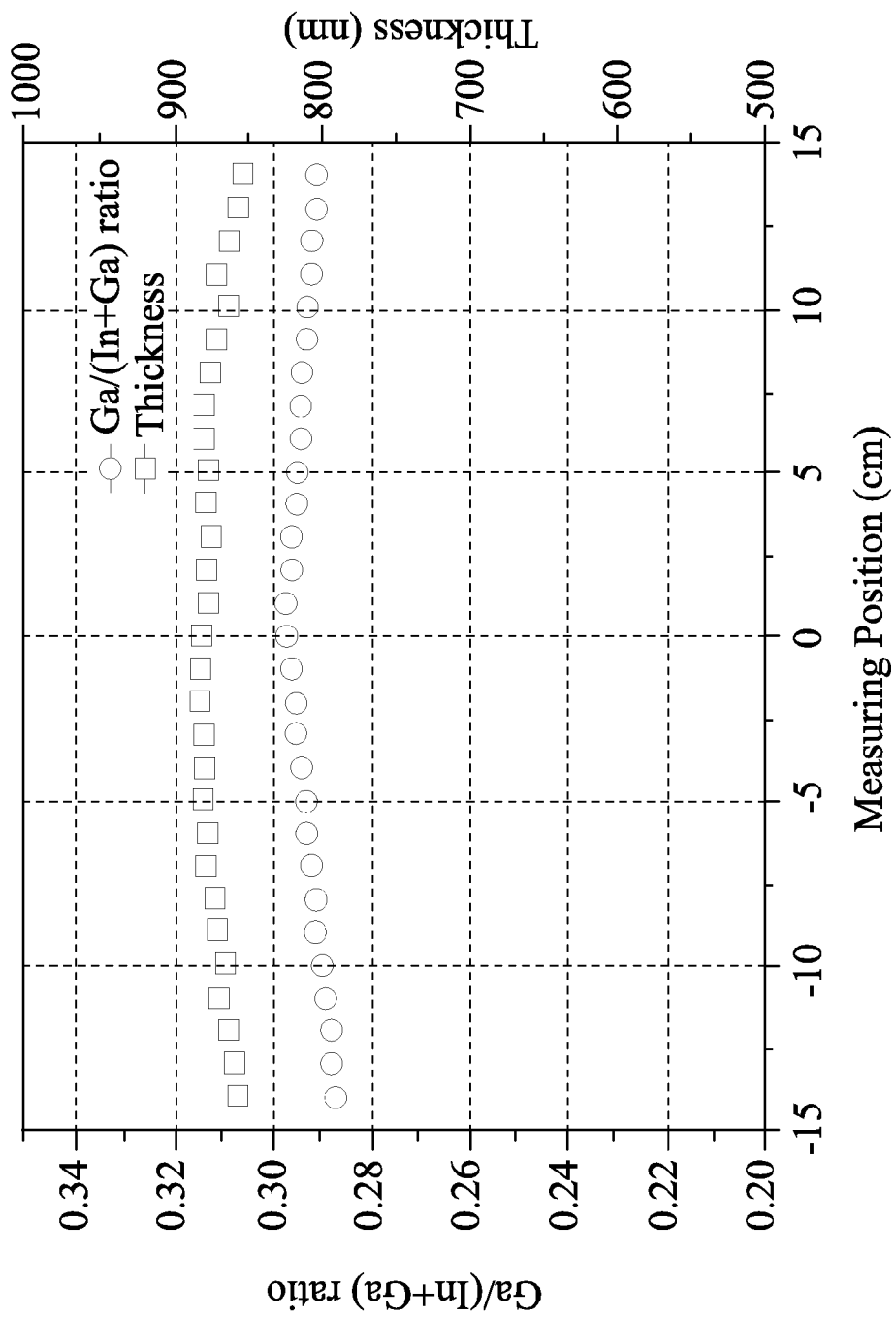
FIG. 6 is a graph showing the relation of the thickness of a thin film measured in the perpendicular direction of an evaporation source versus the composition of the thin film.
Figure 7:
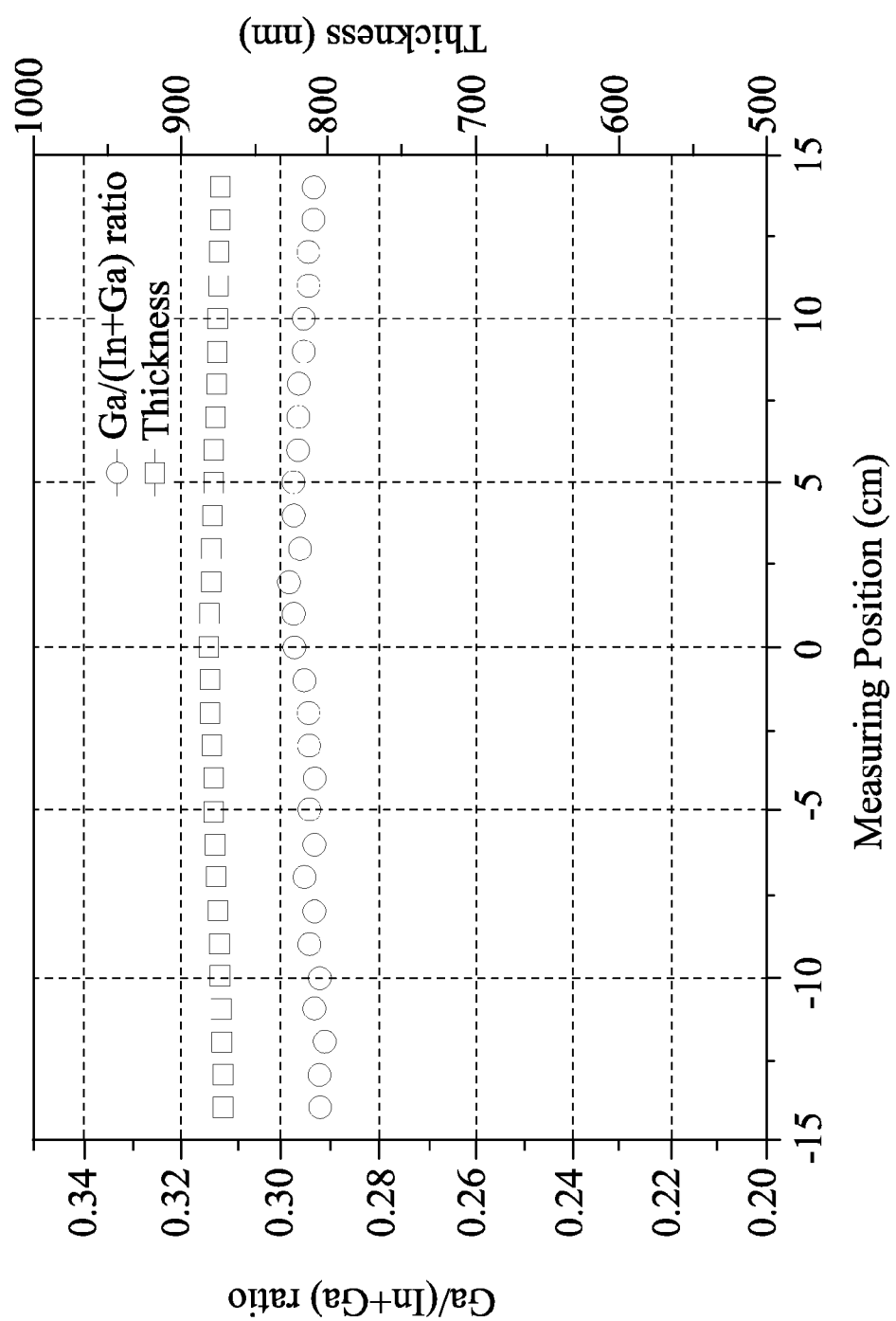
FIG. 7 is a graph showing the relation of the thickness of a thin film measured in the parallel direction of an evaporation source versus the composition of the thin film.
Figure 8:
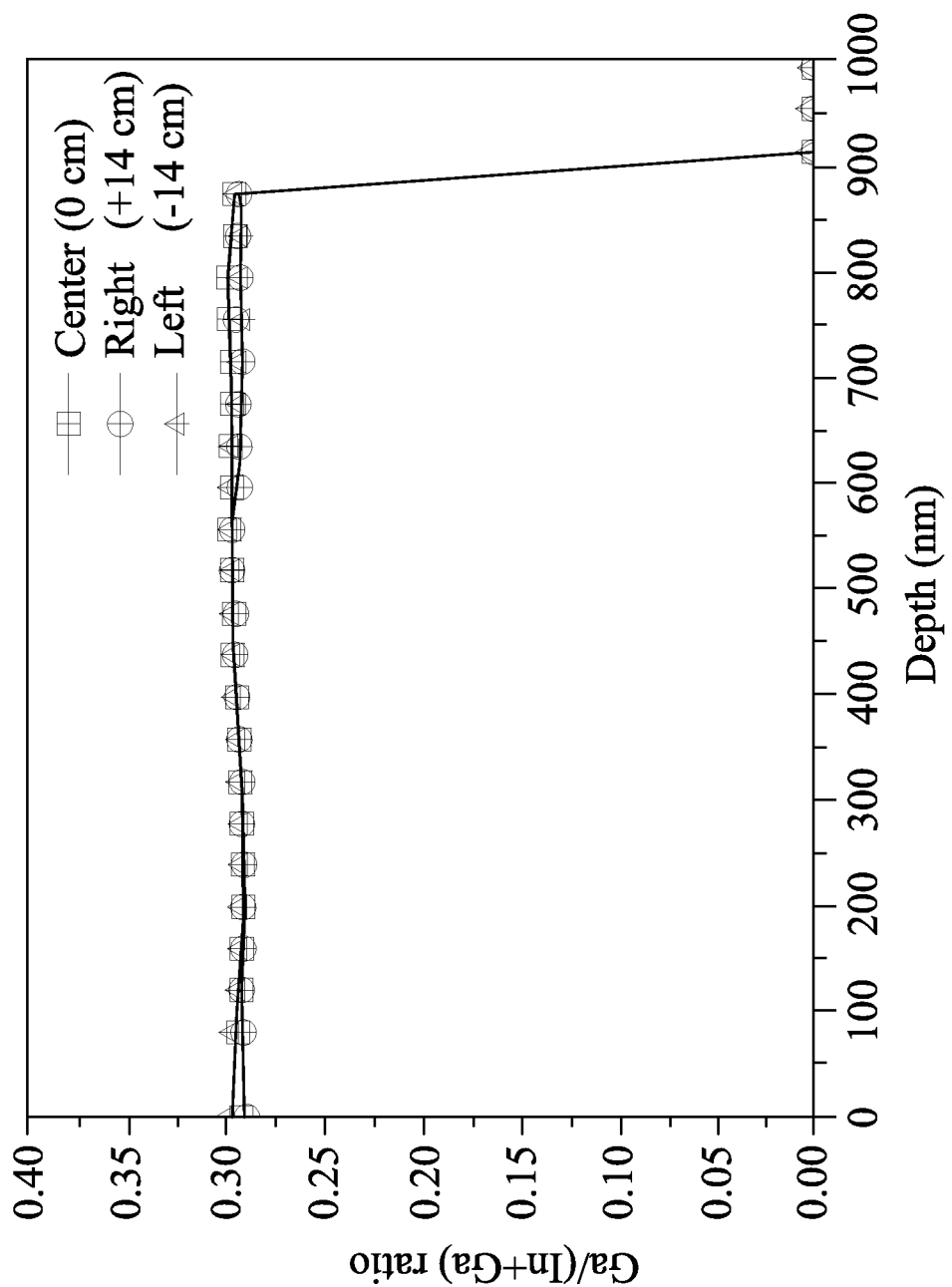
FIG. 8 is a graph showing the relation of the depth of a thin film measured in the perpendicular direction of an evaporation source versus the composition of the thin film.
Figure 9:
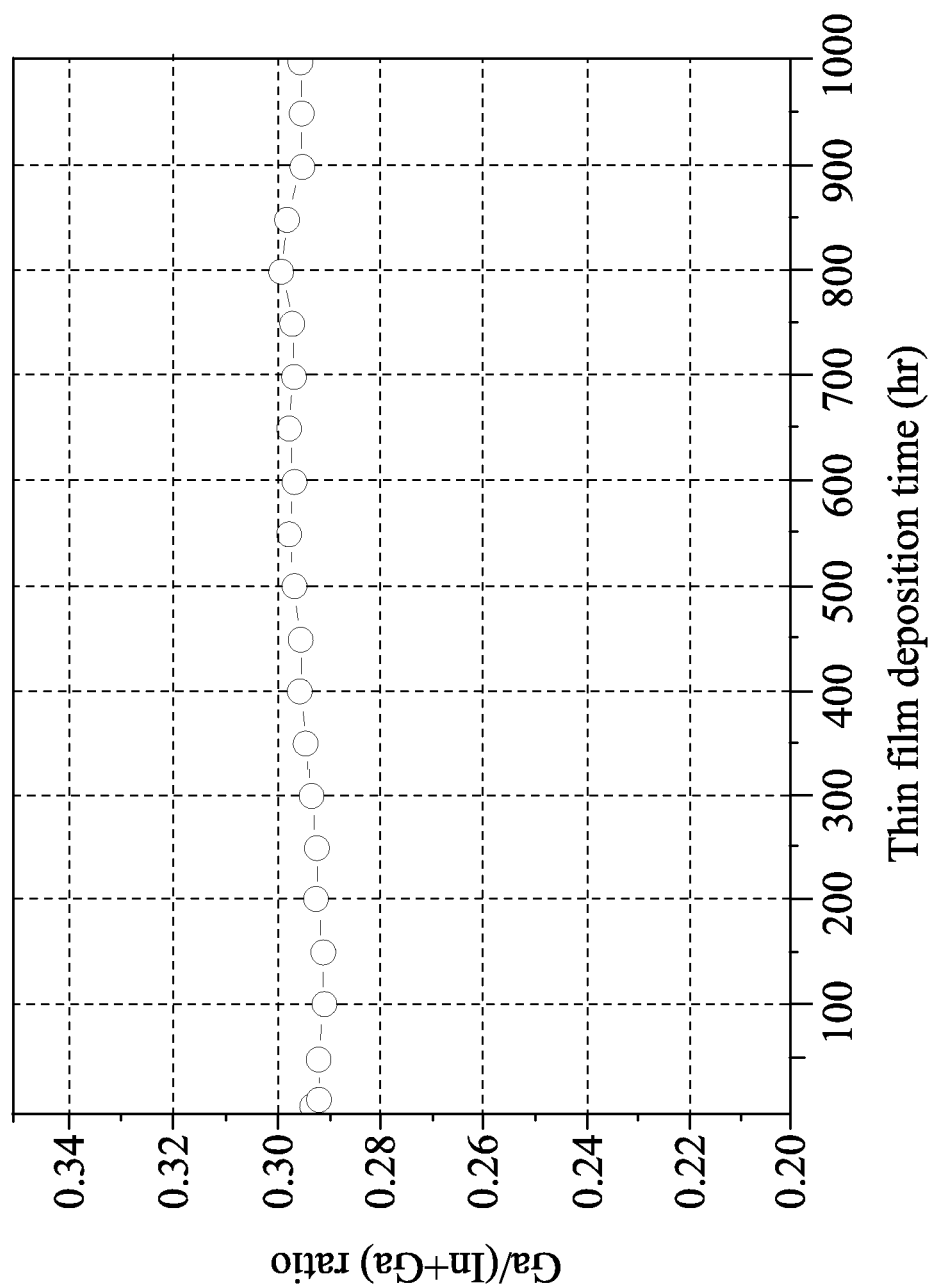
FIG. 9 is a graph showing the composition of a thin film measured at different vapor deposition time.

The measurement results obtained after using the present invention to carry out the film deposition are described below and shown in FIGS. 6-9. The present invention carries out the film deposition on the substrate 20 in the vacuum environment system 2, and a selenium evaporation source is provided for carrying out the mixing and evaporation process, and the temperature of the selenium evaporation source is set at 250-400° C., wherein the substrate 20 is a glass sheet structure with a thickness of 3 mm and an area of 30 cm*30 cm, and the evaporation materials 10 are indium (In) and gallium (Ga) placed in the evaporation vessels 11, and the ratio of the area of the flow hole 141 of the evaporation vessel 11 containing gallium to the area of the flow hole 141 of the evaporation vessel 11 containing indium is equal to 2.3, and the nozzle orifice 131 of the pressure stabilizing chamber 13 is a linear opening with an area of 25 cm*2 mm, and the pressure of the vacuum environment system 2 has the vacuum background pressure P3 controlled at $1\times10^{-6}$ Torr by the vacuum pump, and the temperature of the heaters 12 is set to 1080-1120° C., and the distance between the pressure stabilizing chamber 13, the selenium evaporation source, and the substrate 20 is 30 cm, and the processing time is 10 minutes. During the vapor deposition process, the vapor of indium and the vapor of gallium contained in the evaporation vessels 11 reach the first vapor saturation pressure P1 and flow towards the pressure stabilizing chamber 13 and mix with one another. After the pressure stabilizing chamber 13 has reached the second vapor saturation pressure P2, the vapors flow towards the vacuum environment system 2 while mixing the vapor of the selenium evaporation source and being evaporated at the substrate 20. After the thin film is formed, an X-ray fluorescence spectrometer is used to analyze the thickness and composition of the indium-gallium-selenium thin film deposited at the substrate 20, and the proportion of the gallium/(indium+gallium) or [Ga/(In+Ga)] composition is equal to 0.28-0.3. With reference to FIGS. 6 and 7 for the thickness and composition of the indium-gallium-selenium thin film, the error value of the thickness along the direction perpendicular to the evaporation source measured from the center of the evaporation source falls within 1% for the range of ±5 cm, 2% for the range of ±10 cm, and 3% for the range of ±15 cm, and the error value of the thickness along the direction parallel to the evaporation source measured from the center of the evaporation source falls within 1% for the range of ±15 cm. From the aforementioned results, regardless of being perpendicular or parallel to the evaporation source, the thin film has an excellent uniformity, and the error value is substantially smaller than 2%-3%. Further, a secondary ion mass spectrometer is used to analyze the depth profile of the thin film in a direction perpendicular to the evaporation source, and three points including the center (0 cm), the left (−14 cm) and the right (+14 cm) of the thin film are used for the analysis, and the results are shown in FIG. 8. The proportion of the gallium/(indium+gallium) or [Ga/(In+Ga)] composition shows a substantial average result of the depth value from the surface to the bottom of the thin film. Finally, the composition of the thin film formed by the present invention is measured at different evaporation time, and the results are shown in FIG. 9. FIG. 9 shows that the thin film does not have a significant change of composition varied with the processing time, and the error values of the composition are smaller than 2%. The aforementioned measurement results show that the method and apparatus of the present invention provide a highly stable vapor deposition process, so that the produced thin film has high uniformity and quality, and there is no temperature difference of the evaporation vessel 11 during the evaporation time, and thus the evaporation rate will not be affected.

In the method and apparatus of the present invention, a constant pressure difference is used to control the deposition rate, so that the vapor of the evaporation material 10 can be used to perform the film deposition of the substrate 20 at a constant rate, so as to prevent the temperature difference of the evaporation vessel 11 when the evaporation material 10 decreases with the evaporation time, and the liquid level drops, and thus maintaining the uniformity of the composition and the uniformity of thickness of the thin film on the substrate 20 and preventing a change of the evaporation rate. The invention not just maintains the stability of the evaporation only, but also enhances the uniformity of the thin film significantly.

What is claimed is:
1. A method for evaporation depositing uniform thin films, provided for evaporation depositing the thin film on a substrate in a vacuum environment system to enhance the uniformity of the thin film by maintaining the deposition rate, and the method comprising the steps of:
   placing at least one evaporation material in at least one evaporation vessel, and heating the evaporation material by at least one heater, wherein a cover is installed on a wall of the evaporation vessel;
   controlling the evaporation by the cover, such that the interior of the evaporation vessel has a first vapor saturation pressure when the evaporation material is heated to an evaporation state;

flowing a vapor of the evaporation material towards a pressure stabilizing chamber, such that the interior of the pressure stabilizing chamber has a second vapor saturation pressure, wherein the second vapor saturation pressure is smaller than the first vapor saturation pressure, so that the vapor of the evaporation material continues flowing into the pressure stabilizing chamber; and the vacuum environment system has a vacuum background pressure, and the vacuum background pressure is smaller than the second vapor saturation pressure, and the vapor of the evaporation material flows from the pressure stabilizing chamber to the vacuum environment system due to the pressure difference between the second vapor saturation pressure and the vacuum background pressure, so as to evaporation depositing the substrate at a constant rate.

2. The method according to claim 1, wherein the evaporation material comes with a plural quantity, and the evaporation materials are disposed at corresponsive spaces inside the evaporation vessel respectively, and when each evaporation vessel reaches the first vapor saturation pressure, the evaporation materials flow into the pressure stabilizing chamber one by one and mix with one another.

3. The method according to claim 1, wherein the evaporation material comes with a plural quantity, and the evaporation materials are disposed at corresponsive spaces inside the evaporation vessel respectively, and the pressure stabilizing chamber also comes with a quantity corresponsive to the quantity of the evaporation vessels, so that when each of the evaporation vessel reaches the first vapor saturation pressure, the evaporation materials flow into the pressure stabilizing chambers respectively, and then flow from the respective pressure stabilizing chambers into the vacuum environment system for mixing and evaporation depositing the substrate.

* * * * *